United States Patent
Wang et al.

(10) Patent No.: US 7,449,776 B2
(45) Date of Patent: Nov. 11, 2008

(54) COOLING DEVICES THAT USE NANOWIRES

(75) Inventors: Shih-Yuan Wang, Palo Alto, CA (US); M. Saif Islam, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/126,430

(22) Filed: May 10, 2005

(65) Prior Publication Data

US 2006/0255452 A1 Nov. 16, 2006

(51) Int. Cl.
*H01L 23/38* (2006.01)
*H01L 23/473* (2006.01)
(52) U.S. Cl. .................. 257/714; 257/707; 62/3.7
(58) Field of Classification Search ................ 257/720, 257/707, 714; 62/3.7
See application file for complete search history.

(56) References Cited

U.S. PATENT DOCUMENTS

2002/0172820 A1*  11/2002  Majumdar et al. .......... 428/357
2003/0089899 A1*  5/2003   Lieber et al. ................. 257/9
2005/0037204 A1*  2/2005   Osiander et al. ............ 428/408
2005/0046017 A1*  3/2005   Dangelo ...................... 257/720
2005/0126766 A1*  6/2005   Lee et al. ..................... 165/133
2005/0254208 A1*  11/2005  Belady et al. ............... 361/690
2006/0104885 A1*  5/2006   Chih et al. ................... 423/446

OTHER PUBLICATIONS

Ashfold et al., Thin Film Diamond by Chemical Vapour Deposition Methods, Chemical Society Reviews, 1994, pp. 21-20.*
Yu et al., Active cooling of Integrated Circuits and Optoelectronic Devices Using A Micro Configured Thermoelectric and Fluidic System, Inter Society Conference on Thermal Phenomena, 2000, pp. 134-139.*
May et al., Preparation of Solid and Hollow Diamond Fibres and the Potential for Diamond Fibre Metal Matrix Composites, Journal of Materials Science Letters, vol. 13, 1994, pp. 247-249.*
Chih et al., Formation of nano-scale tubular structure of single crystal diamond, Diamond and Related Materials, vol. 13, 2004, pp. 1614-1617.*

* cited by examiner

*Primary Examiner*—David Vu
*Assistant Examiner*—Earl N Taylor (57) ABSTRACT

Different types of cooling devices using nanowires are described. For example, a cooling device may include a plurality of diamond nanowires coupled to a surface. The diamond nanowires conduct heat energy from the surface and dissipate the heat energy into a neighboring fluid.

6 Claims, 9 Drawing Sheets

COOLING DEVICES THAT USE NANOWIRES

TECHNICAL FIELD

Embodiments of the present invention relate to nanotechnology.

BACKGROUND ART

Electronic components are becoming smaller and are more closely packed together inside devices. Also, components such as microprocessors are operating at higher power densities and thus are generating higher heat loads. Increased cooling capability is needed; however, providing adequate cooling is made difficult by the limited space available for cooling devices.

A cooling device that can address the above concerns would be advantageous.

DISCLOSURE OF THE INVENTION

Embodiments in accordance with the present invention pertain to types of cooling devices that use nanowires. In one embodiment, a cooling device includes a plurality of diamond nanowires coupled to a surface. The diamond nanowires conduct heat energy from the surface and dissipate the heat energy into a neighboring fluid.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Figure 1:
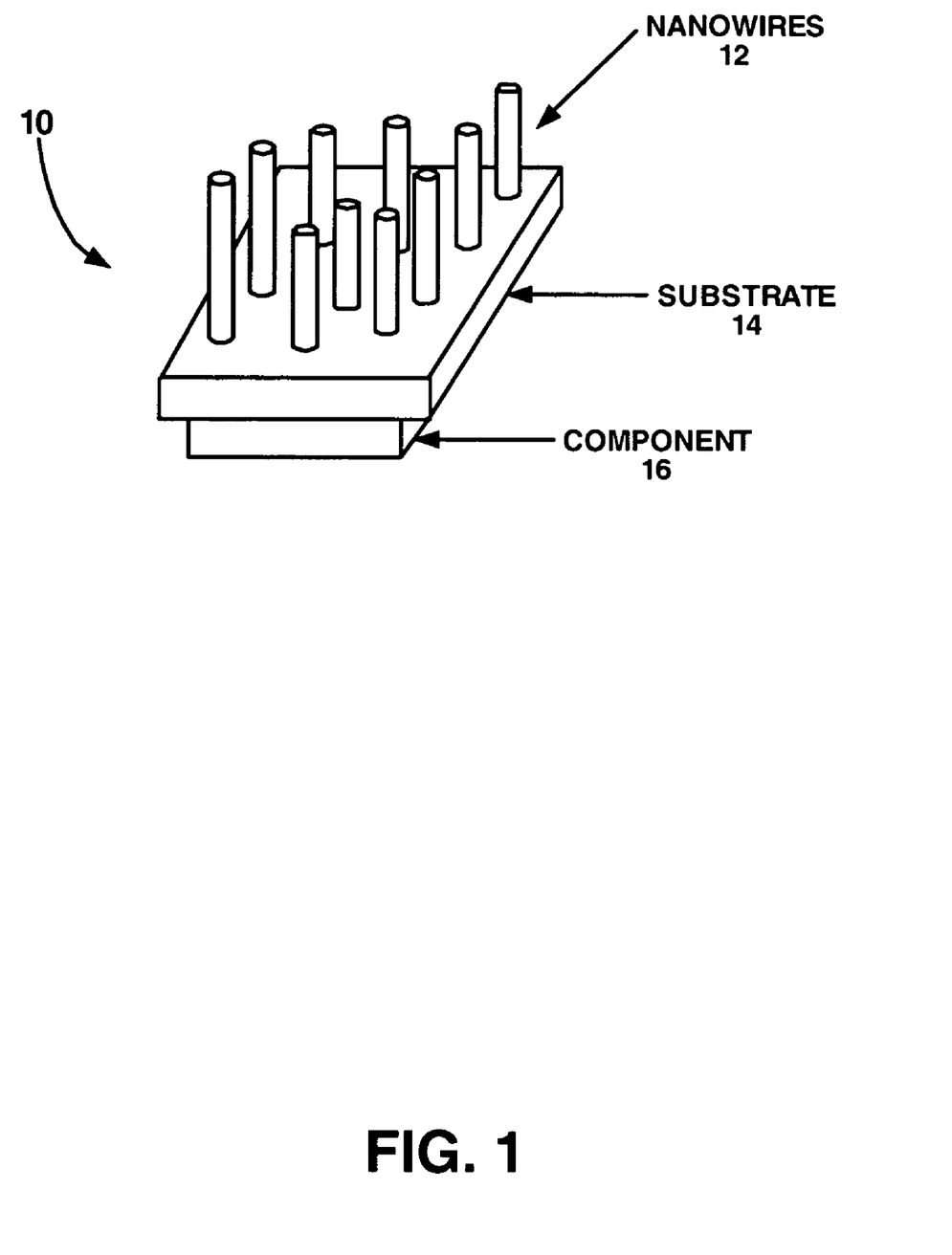
FIG. 1 illustrates one embodiment of a cooling device that uses nanowires in accordance with the present invention.

FIG. 1 illustrates one embodiment of a cooling device 10 in accordance with the present invention. In the embodiment of FIG. 1, cooling device 10 includes a plurality of nanowires 12 mounted on (coupled to) a first surface or substrate 14. In one embodiment, the nanowires 12 have a diameter of less than approximately 100 nanometers. For clarity of illustration, only a limited number of nanowires are illustrated; in practice, there may be many such nanowires.

In one embodiment, cooling device 10 (e.g., nanowires 12 and substrate 14) is mounted onto an object to be cooled (e.g., component 16). In such an embodiment, a conductive material (e.g., a gel or paste) may be used between substrate 14 and component 16, to facilitate proper contact between these two elements and enhance heat transfer. In another embodiment, the nanowires 12 are formed on (e.g., coupled directly to) the object to be cooled.

In one embodiment, the nanowires 12 are diamond nanowires. The substrate 14 may be a thin film. In general, substrate 14 consists of a material (or a combination of materials) that efficiently conducts heat energy away from component 16. In one embodiment, substrate 14 is a diamond substrate.

In operation, in the embodiment of FIG. 1, heat energy is conducted from component 16 through substrate 14 to nanowires 12. Because of their large surface-to-volume ratio, nanowires—and in particular diamond nanowires—efficiently conduct the heat energy away from substrate 14. Heat energy from the nanowires 12 is dissipated into a neighboring fluid (e.g., a gas or liquid). Fans or other types of devices can be employed to move the fluid. In one embodiment, a liquid (e.g., water) is sprayed onto the nanowires 12 to facilitate cooling. To achieve a fine liquid spray, an inkjet printer head (an inkjet cartridge), adapted to dispense water instead of ink, may be used.

Nanowires 12 are effective for dissipating heat because of their high surface-to-volume ratio. Diamond is particularly effective for removing heat because of its high conductivity.

In the example of FIG. 1, the broadest surface of substrate 14 is mounted on the broadest surface of component 16, in a sandwich-style arrangement. Alternatively, substrate 14 (including nanowires 12) can be mounted orthogonally onto component 16. That is, if substrate 14 and component 16 are each characterized as being planar, then the plane of substrate 14 can be parallel to or perpendicular to the plane of component 16. Substrate 14 can also be mounted at an angle less than perpendicular, in particular in an embodiment in which the nanowires 12 are on the surface of substrate 14 that faces away from component 16. When substrate 14 is mounted onto component 16 orthogonally or at an angle, substrate 14 is in effect a fin that functions to cool component 16. When mounted as a fin, multiple instances of substrate 14, each essentially parallel with the others, can be mounted on component 16. With substrate 14 mounted as a fin, the nanowires 12 can be formed one side or to both sides of substrate 14, and also to the "top" or edge of substrate 14 (that is, when mounted as a fin, nanowires 12 can be formed on any exposed surface of substrate 14).

Figure 2:
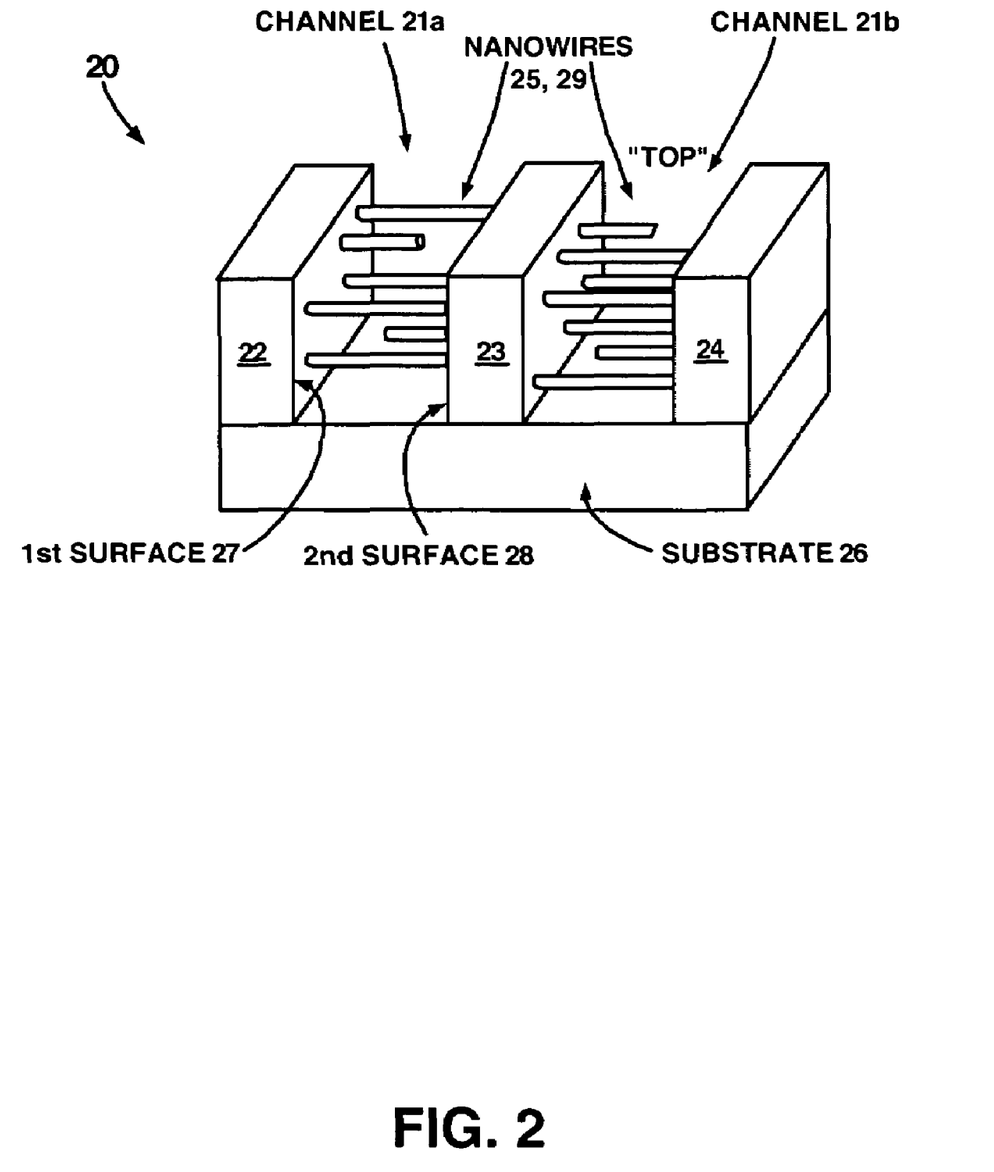
FIG. 2 illustrates another embodiment of a cooling device that uses nanowires in accordance with the present invention.

FIG. 2 illustrates one embodiment of a cooling device 20 in accordance with the present invention. In the embodiment of FIG. 2, a number of elements 22, 23 and 24 are mounted on a substrate 26. A channel is defined by two adjacent elements (e.g., channel 21a is defined by elements 22 and 23, and channel 21b is defined by elements 23 and 24). Although two channels are illustrated in FIG. 2, the present invention is not so limited. Also, the channels 21a and 21b may be enclosed across the "top" of their respective openings (here, "top" is with reference to the orientation of FIG. 2).

Within channels 21a and 21b are nanowires 25 and 29, respectively. For clarity of illustration, only a limited number of nanowires are illustrated; in practice, there may be many such nanowires. Some or all of the nanowires 25 extend from first surface 27 to second surface 28, bridging the gap (channel 21a) between the first and second elements 22 and 23. Similarly, some or all of the nanowires 29 extend across channel 21b. In one embodiment, the widths of channels 21a and 21b are less than approximately ten (10) microns each. In another embodiment, the widths of channels 21a and 21b are in the range of approximately 10-50 microns each.

In one embodiment, the nanowires 25 and 29 are diamond nanowires. In another embodiment, the nanowires 25 and 29 are silicon nanowires. Other materials such as carbon may be used. In general, the nanowires consist of a material that conducts heat energy.

As mentioned above, in the embodiment of FIG. 2, the elements 22, 23 and 24 are mounted on substrate 26. Alternatively, the elements 22, 23 and 24 may be formed from the substrate 26. That is, for example, channel 21a (and hence elements 22 and 23) may be formed by selectively etching substrate 26.

Cooling device 20 can be mounted on an object to be cooled (not shown). Alternatively, the substrate 26 can represent the object to be cooled; that is, the elements 22, 23 and 24 (and the nanowires mounted therebetween) may be mounted directly on the object to be cooled. As mentioned above, a gel or paste may be used to facilitate contact and heat transfer between surfaces.

In operation, in the embodiment of FIG. 2, heat energy is conducted, from substrate 26 to elements 22, 23 and 24. Nanowires 25 and 29 efficiently conduct the heat energy away from the elements 22, 23 and 24 into a neighboring fluid (e.g., a gas or liquid). Fans or other types of devices can be employed to move the fluid. In one embodiment, a liquid (e.g., water) is sprayed onto the nanowires 25 and 29 to facilitate cooling.

Figure 3:
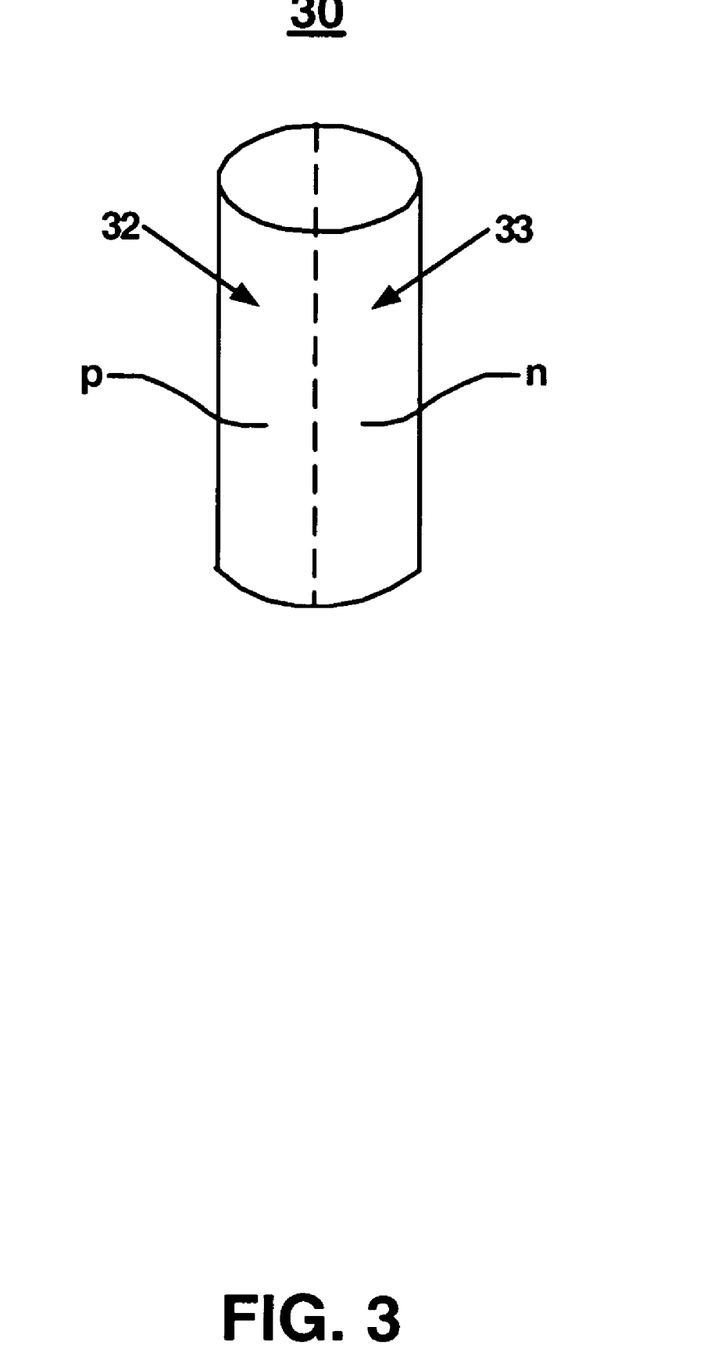
FIG. 3 illustrates one embodiment of a p-n junction in a nanowire in accordance with the present invention.
Figure 4:
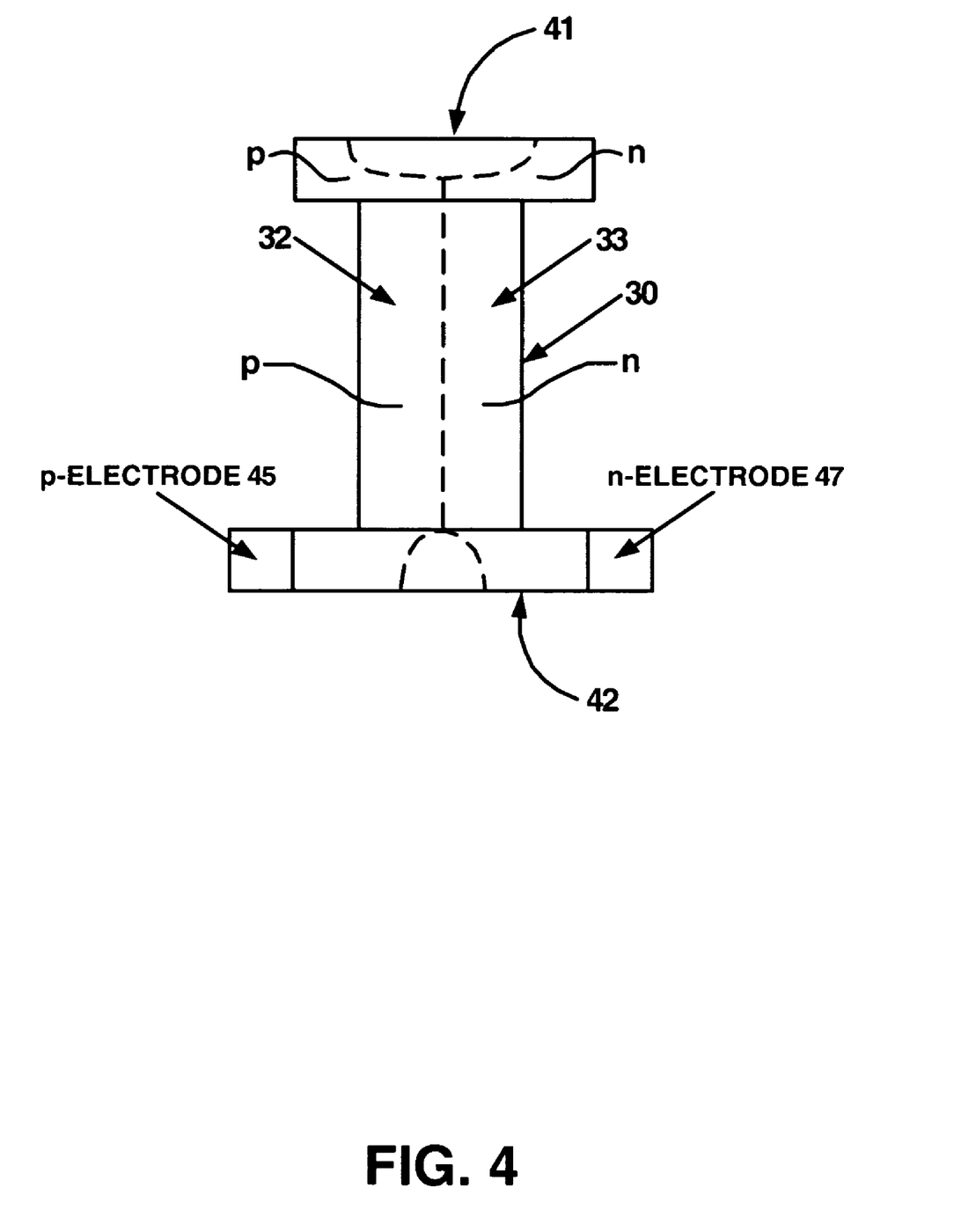
FIG. 4 illustrates another embodiment of a p-n junction in a nanowire in accordance with the present invention.

In one embodiment, for thermoelectric cooling, a first portion of some or all of the nanowires 25 and 29 is doped with a p-type dopant (e.g., boron), and a second portion of some or all of the nanowires 25 and 29 is doped with an n-type dopant (e.g., phosphorous), thereby forming a p-n junction in each selected nanowire (see FIGS. 3 and 4). When an electrical current is applied to the nanowires, the p-n junctions are effective for draining heat from the elements 22, 23 and 24, thereby enhancing the cooling capabilities of cooling device 20.

FIG. 3 illustrates one embodiment of a p-n junction in a nanowire 30 in accordance with the present invention. In the example of FIG. 3, the nanowire 30 includes a region 32 of p-type dopant and a region 33 of n-type dopant, forming a p-n junction along the length of the nanowire 30.

FIG. 4 illustrates a nanowire 30 formed between a first element 41 and a second element 42 according to one embodiment of the present invention. The first and second elements 41 and 42 may correspond to an adjacent pair of the elements 22, 23 and 24 of FIG. 2, for example. In the example of FIG. 4, electrical contact is made at one end of nanowire 30, using p-electrode 45 and n-electrode 47. In general, electrical contact to each of the regions 32 and 33 is made to complete a circuit for thermoelectric cooling.

Figure 5:
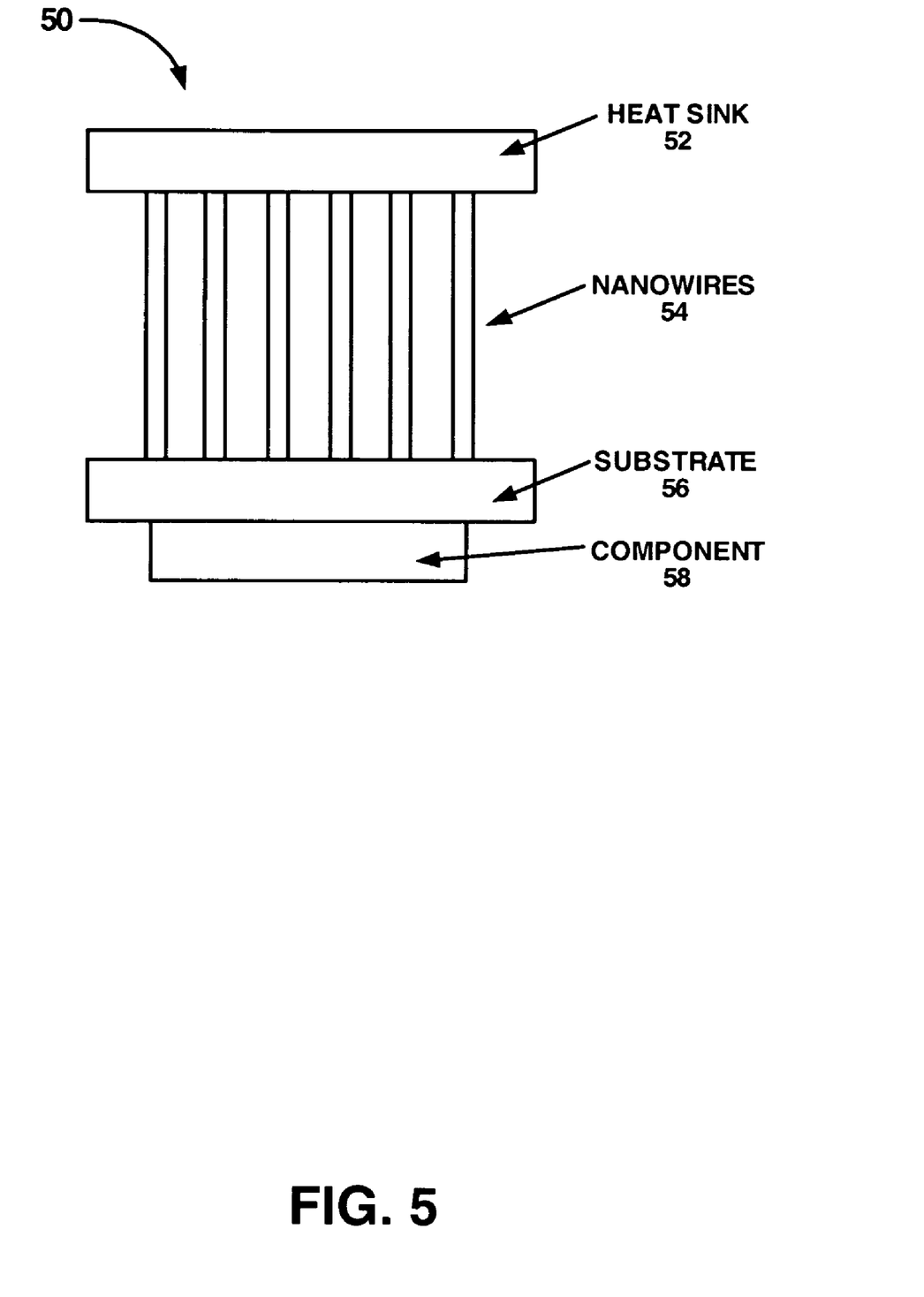
FIG. 5 illustrates another embodiment of a cooling device that uses nanowires in accordance with the present invention.

FIG. 5 illustrates one embodiment of a cooling device 50 that uses nanowires in accordance with the present invention. In the embodiment of FIG. 5, nanowires 54 are coupled to a heat sink 52 and also to substrate 56, which in turn is coupled to an object to be cooled (e.g., component 58). As discussed above, the nanowires 54 may instead be coupled directly to (e.g., formed directly on) the object to be cooled. For clarity of illustration, only a limited number of nanowires are illustrated; in practice, there may be many such nanowires.

In one embodiment, the nanowires 54 are diamond nanowires. In another embodiment, the nanowires 54 are silicon nanowires. In general, the nanowires consist of a material that conducts heat energy.

In one embodiment, as described in conjunction with FIG. 3 above, a first portion of some or all of the nanowires 54 is doped with a p-type dopant, and a second portion of some or all of the nanowires 54 is doped with an n-type dopant, thereby forming a p-n junction (e.g., p-n junction 55) in each selected nanowire. When a current is applied to the nanowires, the p-n junctions are effective for draining heat from substrate 56 to heat sink 52.

Fans or other types of devices can be employed to move a fluid around the nanowires 54. In one embodiment, a liquid (e.g., water) is sprayed onto the nanowires 54 to enhance cooling.

Figure 6:
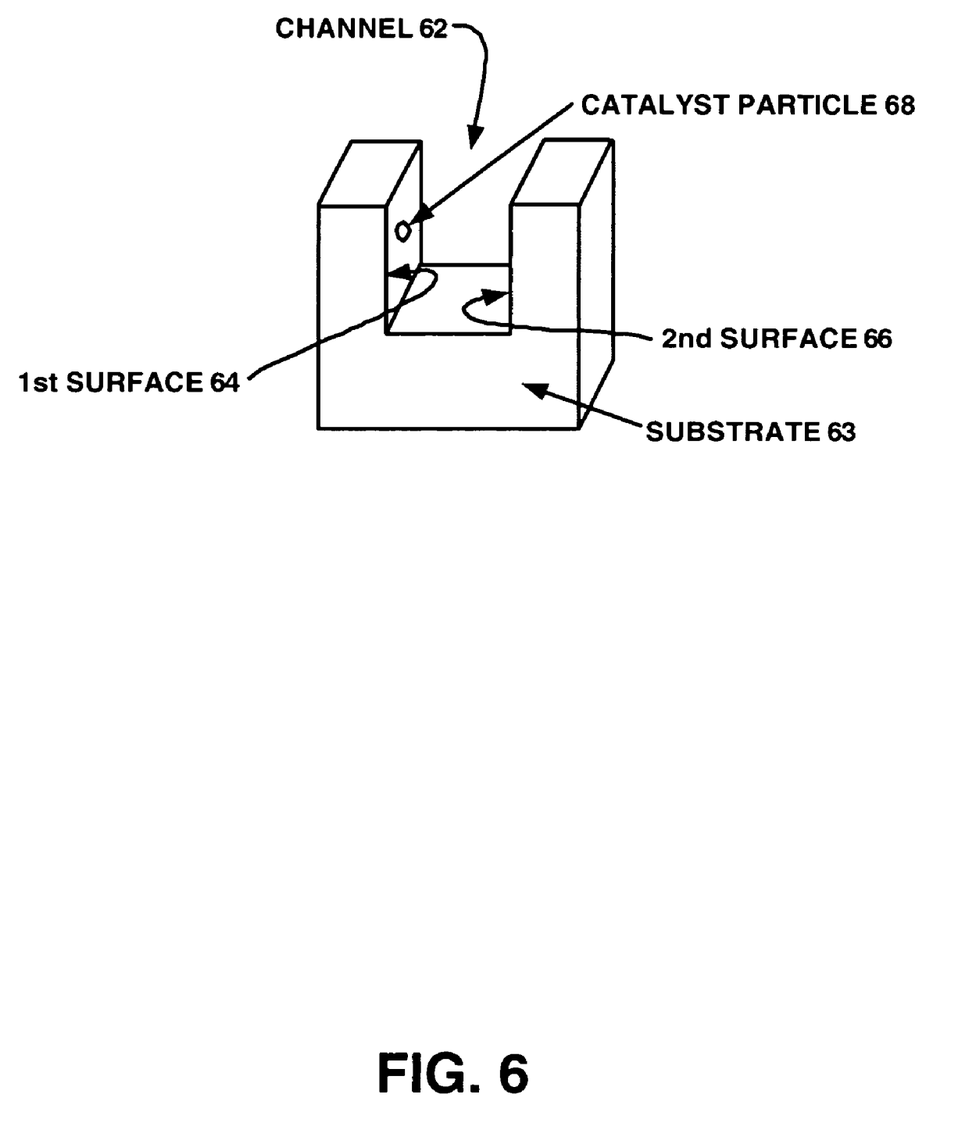
FIG. 6 illustrates a stage in one embodiment of a method of forming a cooling device in accordance with the present invention.

FIG. 6 illustrates a stage in one embodiment of a method of forming a cooling device (e.g., cooling devices 20 and 50 of FIGS. 2 and 5, respectively) in accordance with the present invention. First, channel 62 is formed. In one embodiment, the channel 62 is etched (e.g., using anisotropic wet chemical etching) into the substrate 63. In one embodiment, the sidewalls of channel 62 (e.g., first surface 64 and second surface 66) are substantially parallel to each other.

Next, a nanowire (e.g., a diamond or silicon nanowire) is grown across the gap between the first and second surfaces 64 and 66 of FIG. 6. In one embodiment, a thin layer of a catalyst is deposited on at least one of the surfaces (e.g., first surface 64). The catalyst may be metallic, such as gold or titanium. The catalyst is then annealed to form isolated nanoparticles of the catalyst material (e.g., catalyst particle 68).

Figure 7:
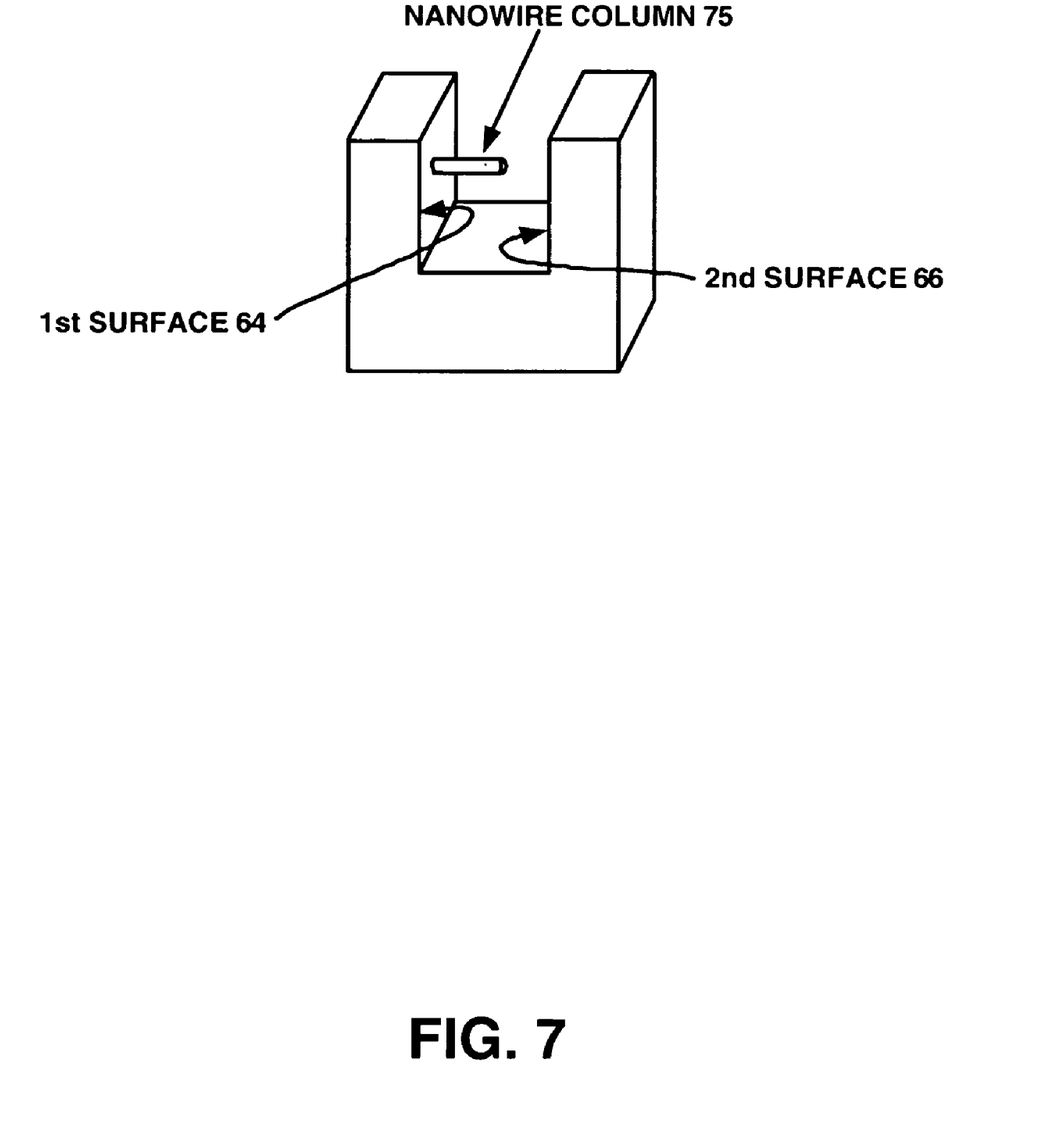
FIG. 7 illustrates another stage in one embodiment of a method of forming a cooling device in accordance with the present invention.

With reference now to FIG. 7, the catalyst is then exposed to nanoparticles of the material (e.g., silicon or diamond) that will compose the nanowires being formed. In one embodiment, the nanoparticles are diffused around catalyst particle 68 (FIG. 6) using plasma chemical vapor deposition (CVD) or metal-organic chemical vapor deposition (MOCVD). The nanoparticles are precipitated on the first surface 64 in the area of the catalyst particle 68. Specifically, the nanoparticles diffuse around the catalyst particle 68 and precipitate on the underlying substrate. Continued precipitation at the nanoparticle-catalyst interface pushes the catalyst particle 68 from the surface, forming column 75. The catalyst particle remains at the tip of the growing column 75. The growing column 75 has a diameter similar to that of the catalyst particle at the tip of the column. The nanowire column 75 can continue to grow in this manner until it makes contact with the second surface 66, thereby forming a nanowire (e.g., one of the nanowires 25 or 29 of FIG. 2) that bridges the gap between the first and second surfaces 64 and 66. In this manner, a device such as cooling device 20 of FIG. 2 can be formed (the first and second surfaces 64 and 66 are analogous to the elements 22 and 23 of FIG. 2). In a similar manner, a device such as cooling device 50 of FIG. 5 can be formed (in which the first and second surfaces 64 and 66 are analogous to the substrate 56, or the component 58, and the heat sink 52 of FIG. 5).

In one embodiment, for thermoelectric cooling, a p-n junction is formed along the length of the nanowire, as illustrated in FIG. 3. For example, after the nanowire column 75 has finished growing to form a nanowire, one portion of the nanowire can be implanted with p-type dopant and another portion with n-type dopant.

Figure 8:
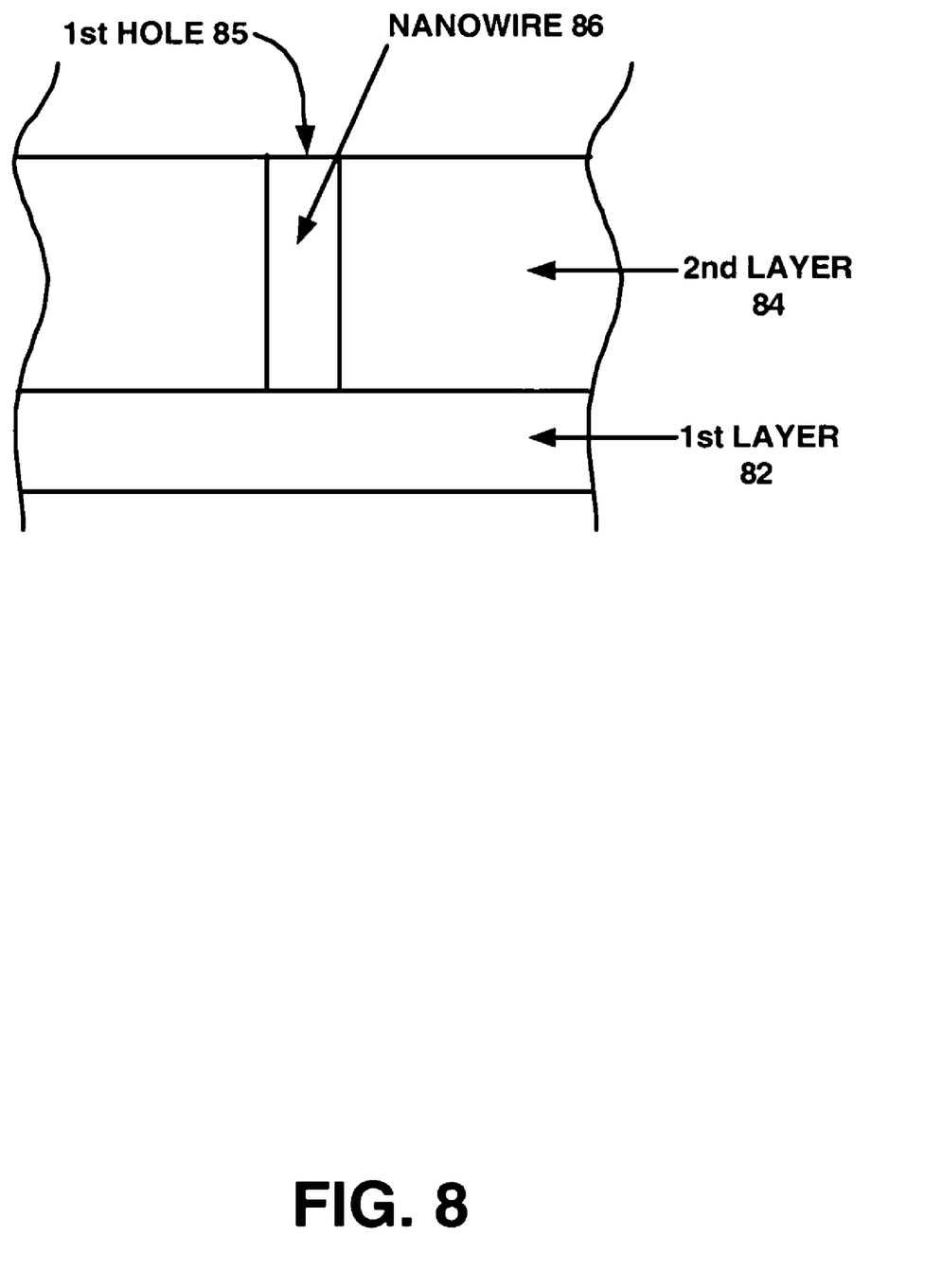
FIG. 8 illustrates a stage in another embodiment of a method of forming a cooling device in accordance with the present invention.

FIG. 8 illustrates a stage in another embodiment of a method of forming a cooling device (e.g., cooling device 10 of FIG. 1) in accordance with the present invention. A first hole 85 is formed in a laminate that includes a first layer 82 and a second layer 84. Various techniques can be used to form the laminate. In one embodiment, layer 82 is a silicon substrate, and layer 84 is a material such as aluminum oxide ($Al_2O_3$). In essence, the first and second layers 82 and 84 and the hole 85 serve as a template for forming a nanowire. A single hole 85 is shown; in actual practice, there may be many such holes.

The hole 85 is filled with the material (e.g., silicon or diamond) that will compose the nanowire 86 being formed. In one embodiment, the first layer 82 is heated, in essence causing the material deposited in the hole 85 to clump together to form a nanowire.

If hole 85 is overfilled, then chemical-mechanical polishing (CMP) can be performed to remove any excess fill that is protruding from hole 85.

In one embodiment, for thermoelectric cooling, a p-n junction is formed along the length of the nanowire 86, as illustrated in FIG. 3. For example, after the nanowire 86 has been formed, one portion of the nanowire can be implanted with p-type dopant and another portion with n-type dopant.

As noted above, there can be many holes such as hole 85 (FIG. 8). Once those holes are filled, the second layer 84 can be removed (e.g., etched out), so that the nanowires (e.g., nanowire 86) and the first layer 82 remain. Nanowires formed in this manner are demonstrated to have sufficient strength to remain intact once second layer 84 is removed. In this manner, a device such as cooling device 10 of FIG. 1 can be formed (the first layer 82 is analogous to substrate 14 or component 16 of FIG. 1).

The methodology described in conjunction with FIG. 8 can be extended to form a cooling device such as cooling device 20 or 50 of FIGS. 2 and 5, respectively. In one embodiment, prior to removal of the second layer 84, a third layer 92 (FIG. 7) is formed over the second layer 84. Various techniques can be used to form the third layer 92.

Figure 9:
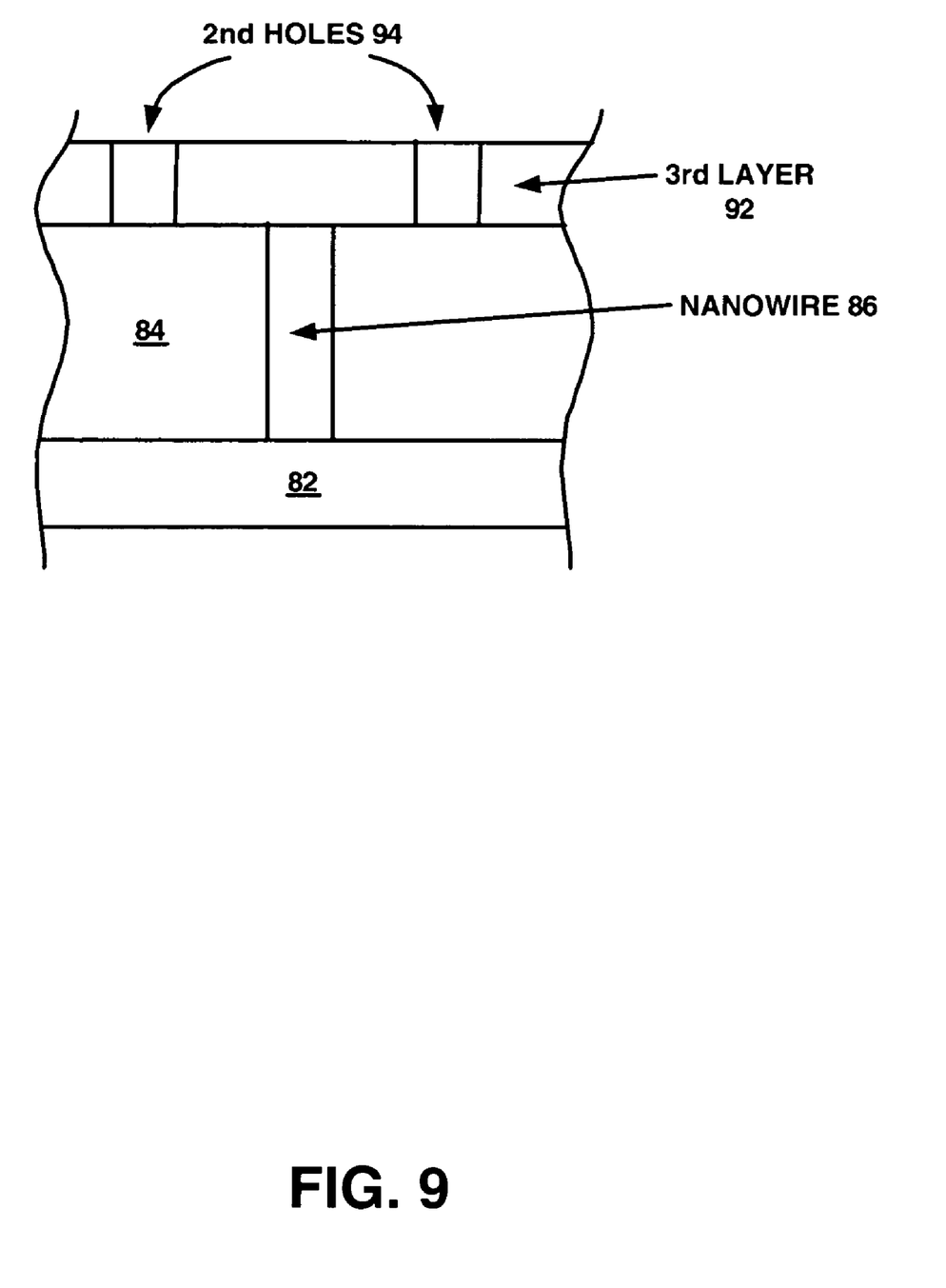
FIG. 9 illustrates a stage in another embodiment of a method of forming a cooling device in accordance with the present invention.

With reference to FIG. 9, second holes 94 are formed in one of the outer layers (e.g., in third layer 92), allowing access to the second layer 84 so that the second layer 84 can be removed (e.g., etched out). After removal of the second layer 84, the nanowire 86 remains, bridging the distance between the first and third layers 82 and 92. Nanowires formed in this manner are demonstrated to have sufficient strength to remain intact once second layer 84 is removed. The methodology just described can be repeated to form additional layers bridged by nanowires. The first and third layers 82 and 92 are analogous to, for example, the first and second elements 22 and 23 of FIG. 2, or the substrate 36 (or component 38) and heat sink 52 of FIG. 5.

Embodiments of the present invention are thus described. While the present invention has been described in particular embodiments, it should be appreciated that the present invention should not be construed as limited by such embodiments, but rather construed according to the following claims.

What is claimed is:

1. A cooling device comprising:
   a channel comprising a first surface and a second surface separated by a gap;
   a first plurality of diamond nanowires grown on said first surface wherein one of said first plurality of diamond nanowires conducts heat energy from said first surface and dissipates said heat energy into a liquid that is in direct contact with said first plurality of nanowires and wherein one of said first plurality of diamond nanowires contacts said second surface, thereby bridging said gap; and
   a second plurality of diamond nanowires grown on said second surface wherein one of said second plurality of diamond nanowires conducts heat energy from said second surface and dissipates said heat energy into said liquid and wherein one of said second plurality of diamond nanowires contacts said first surface, thereby bridging said gap wherein a diamond nanowire in contact with both said first and second surfaces comprises a first portion doped with p-type dopant and a second portion doped with n-type dopant to form a p-n junction in said diamond nanowire, wherein application of an electrical current to said diamond nanowire induces thermoelectric cooling of said diamond nanowire.

2. The cooling device of claim 1 wherein heat energy is conducted by said diamond nanowire from said first surface to said second surface.

3. The cooling device of claim 1 wherein said gap is in the range of approximately 10-50 microns.

4. The cooling device of claim 1 wherein said first surface is mounted as a fin on an object to be cooled.

5. The cooling device of claim 1 wherein said diamond nanowires are sprayed with said liquid.

6. The cooling device of claim 1 wherein said diamond nanowires have diameters of less than approximately 100 nanometers.

* * * * *